USO10012683B2

(12) United States Patent
Qi et al.

(10) Patent No.: US 10,012,683 B2
(45) Date of Patent: Jul. 3, 2018

(54) SYSTEM FOR TESTING WIRELESS TERMINAL AND METHOD FOR CONTROLLING SAME

(71) Applicant: GENERAL TEST SYSTEMS INC., Shenzhen, Guangdong (CN)

(72) Inventors: Yihong Qi, Guangdong (CN); Wei Yu, Guangdong (CN)

(73) Assignee: GENERAL TEST SYSTEMS INC., Shenzhen (CN)

( * ) Notice: Subject to any disclaimer, the term of this patent is extended or adjusted under 35 U.S.C. 154(b) by 37 days.

(21) Appl. No.: 15/504,697

(22) PCT Filed: Apr. 10, 2015

(86) PCT No.: PCT/CN2015/076368
§ 371 (c)(1),
(2) Date: Feb. 17, 2017

(87) PCT Pub. No.: WO2016/161654
PCT Pub. Date: Oct. 13, 2016

(65) Prior Publication Data
US 2018/0149686 A1 May 31, 2018

(51) Int. Cl.
*G01R 27/28* (2006.01)
*H04B 17/00* (2015.01)
*G01R 29/10* (2006.01)

(52) U.S. Cl.
CPC .................................. *G01R 29/105* (2013.01)

(58) Field of Classification Search
CPC ...................................................... G01R 27/32
(Continued)

(56) References Cited

U.S. PATENT DOCUMENTS 7,286,961 B2 * 10/2007 Kildal ................ G01R 29/0821
702/182
8,358,992 B2 * 1/2013 Yu .......................... H04B 17/10
324/627
2010/0306165 A1 12/2010 Gross et al.

FOREIGN PATENT DOCUMENTS

CN 101576591 11/2009
CN 101750549 6/2010
(Continued)

OTHER PUBLICATIONS

D'Agostino, et al., Laboratory Testing on a Nonredundant NF-FF, Antenna Measurements and Applications (CAMA), 2014 IEEE Conference on Nov. 19, 2014.
(Continued)

*Primary Examiner* — Bot Ledynh
(74) *Attorney, Agent, or Firm* — Hodgson Russ LLP

(57) ABSTRACT

Disclosed are a system for testing a wireless terminal and a method for controlling the same. The system includes: a device under test being a wireless terminal; a reflecting surface, configured to totally reflect one or more wireless signals emitted by the wireless terminal; a rotation mechanism, configured to drive the device under test to rotate; a test antenna, configured to receive one or more wireless signals reflected; and an absorbing screen. The device under test, the test antenna and the reflecting surface correspond to a same ellipsoidal surface, the device under test and the test antenna are arranged at two foci of the ellipsoidal surface respectively, and the reflecting surface is arranged on the ellipsoidal surface. The system has advantages of small repetition error of test results, stable test results, high testing efficiency, and low cost.

12 Claims, 5 Drawing Sheets

(58) Field of Classification Search
USPC .......................................................... 324/612
See application file for complete search history.

(56) References Cited

FOREIGN PATENT DOCUMENTS

| CN | 101802625 | 8/2010 | | |
|---|---|---|---|---|
| WO | WO 0175460 A1 | * | 10/2001 | ......... G01R 29/0821 |
| WO | WO 2012171562 A1 | * | 12/2012 | ......... G01R 29/0821 |

OTHER PUBLICATIONS

ISA/CN, International Search Report for PCT/CN2015/076368 dated Jan. 12, 2016.

* cited by examiner

SYSTEM FOR TESTING WIRELESS TERMINAL AND METHOD FOR CONTROLLING SAME

CROSS-REFERENCE TO RELATED APPLICATIONS

This application is a U.S. national phase of International Application No. PCT/CN2015/076368, filed with the State Intellectual Property Office of P. R. China on Apr. 10, 2015, the entire content of which is incorporated herein by reference.

FIELD

The present disclosure relates to wireless terminal technology field, and more particularly to a system for testing a wireless terminal and a method for controlling the same.

BACKGROUND

In the radiation performance test of the wireless terminal, radiation signals in a plurality of directions and receiving sensitivities in the plurality of directions should be measured, and then total radiation power and total radiation sensitivity are obtained by mathematical calculation. Since the antenna of the wireless terminal is not directional usually, but radiates to all directions of space, when testing the wireless performance of the wireless terminal, a basis idea is to put a device under test to a center of a sphere, and to measure signal strengths at a plurality of positions on surface of the sphere by the test antenna, and to calculate the total radiation strength after obtaining measurement values of all positions.

At present, according to a test standard of CTIA (Cellular Telecommunications Industry Association), a big circle method is used mainly. A mobile terminal to be tested is put on a center of a three dimensional turntable, and may rotate around two axes with the turntable. By using one test antenna and setting both the mobile terminal and the test antenna in an anechoic chamber, the direct signals emitted to the test antenna by the mobile terminal are received by the test antenna, and the radiation signals emitted to other directions by the mobile terminal are absorbed by an absorbing material set in the anechoic chamber. When testing, the mobile terminal is rotated with a preset angle interval according to test demand. The mobile terminal is stopped to measure signal strength when rotated to each position. Test time may be reduced by adjusting the angle interval. Test result is generated by integration and other data processing after measuring radiation signals in each direction.

However, as testing speed of this system is low, and it needs that the distance between the test antenna and the device under test should be larger than a far field distance, the device under test is irradiated with the plane wave of the test antenna, thus that a huge volume, a high manufacturing cost, and a small application scope of the testing system are caused.

SUMMARY

According to embodiments of the present disclosure, a system for testing a wireless terminal is provided, which includes: a device under test, in which the device under test is a wireless terminal; a reflecting surface, configured to totally reflect one or more wireless signals emitted by the wireless terminal; a rotating mechanism, configured to fix the device under test, and to drive the device under test to rotate, such that wireless signals emitted by the wireless terminal in a plurality of directions are emitted to the reflecting surface in turn; a test antenna, configured to receive one or more wireless signals reflected; and an absorbing screen, configured to absorb a radio wave; in which the device under test, the test antenna and the reflecting surface correspond to a same ellipsoidal surface, the device under test and the test antenna are arranged at two foci of the ellipsoidal surface respectively, the reflecting surface is arranged on the ellipsoidal surface; and the absorbing screen is arranged on a straight line between the device under test and the test antenna.

According to embodiments of the present disclosure, a method for controlling a system for testing a wireless terminal is provided, in which, the system for testing a wireless terminal includes: a wireless terminal, a test antenna configured to receive one or more wireless signals, a reflecting surface configured to totally reflect one or more wireless signals emitted by the wireless terminal, a rotating mechanism configured to fix the device under test and to drive the device under test to rotate, and an absorbing screen configured to absorb a radio wave, in which the device under test and the test antenna are arranged at two foci of an ellipsoidal surface respectively, the reflecting surface is arranged on the same ellipsoidal surface, the absorbing screen is arranged on a straight line between the device under test and the test antenna, and the method includes: S1, emitting, by the wireless terminal, one or more wireless signals, in which one or more wireless signals emitted to the reflecting surface are reflected to the test antenna by the reflecting surface; S2, superposing the one or more wireless signals reflected to the test antenna in phase at the test antenna; S3, testing the one or more wireless signals emitted to the reflecting surface by the wireless terminal according to a result of superposing in phase; and S4, controlling the rotating mechanism to rotate a preset angle to a preset direction to renew the one or more wireless signals emitted to the reflecting surface, and repeating the S1 to S4 until wireless signal test of a plurality of preset groups of directions is completed.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
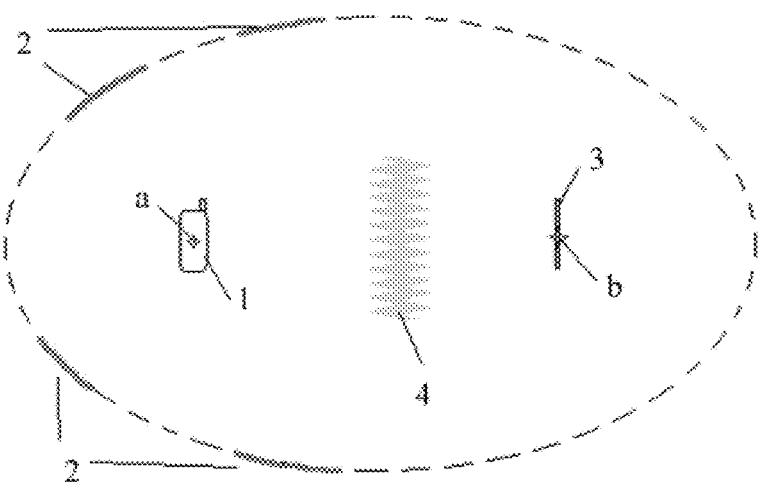
FIG. 1 is a schematic diagram illustrating structure of a system for testing a wireless terminal according to an embodiment of the present disclosure.

Reference will be made in detail to embodiments of the present disclosure. Examples of the embodiments of the present disclosure will be shown in drawings, in which the same or similar elements and the elements having same or similar functions are denoted by like reference numerals throughout the descriptions. The embodiments described herein according to drawings are explanatory and illustrative, not construed to limit the present disclosure.

The system for testing a wireless terminal and the method for controlling a system for testing a wireless terminal according to embodiments of the present disclosure will be descripted with reference to drawings.

FIG. 1 is a schematic diagram illustrating structure of a system for testing a wireless terminal according to an embodiment of the present disclosure.

As shown in FIG. 1, the system for testing a wireless terminal according to an embodiment of the present disclosure, includes a device under test 1, a reflecting surface 2, a test antenna 3, an absorbing screen 4, and a rotating mechanism (which is not shown in the FIG. 1).

In detail, the device under test 1 is a wireless terminal, which may emit one or more wireless signals to the reflecting surface 2.

The reflecting surface 2 is configured to totally reflect the one or more wireless signals emitted by the wireless terminal.

The rotating mechanism is configured to fix the device under test 1, and to drive the device under test 1 to rotate, so as to make wireless signals emitted by the wireless terminal in a plurality of directions to be emitted to the reflecting surface 2 in turn.

The test antenna 3 is configured to receive one or more wireless signals reflected.

The device under test 1, the test antenna 3 and the reflecting surface 2 correspond to a same ellipsoidal surface, in which the device under test 1 and the test antenna 2 are arranged at two foci a and b of the ellipsoidal surface respectively, and the reflecting surface 2 is arranged on the ellipsoidal surface. The reflecting surface 2 is arranged on the ellipsoidal surface, which means that the reflecting surface 2 coincides with the ellipsoidal surface at the position where it is arranged.

Figure 2:
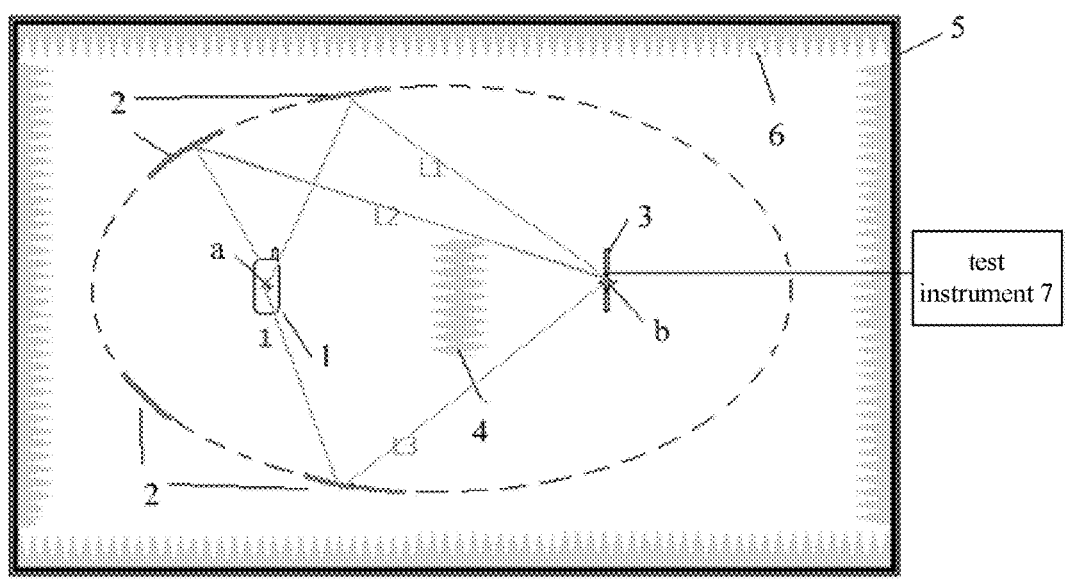
FIG. 2 is a schematic diagram illustrating structure of a system for testing a wireless terminal according to another embodiment of the present disclosure.

In embodiments of the present disclosure, the wireless signal emitted by the wireless terminal may be an electromagnetic wave signal. According to physical principles of ellipsoidal reflection, an electromagnetic wave signal emitted from one focus may be reflected to the other focus by the ellipsoidal surface, and the sum of distances between any point on the ellipsoidal surface and the two foci of the ellipsoidal surface is a fixed value. Therefore, the electromagnetic wave signal emitted by the wireless terminal may be reflected to the test antenna 3 by the reflecting surface 2, and propagation path lengths of a plurality of electromagnetic wave signals that are emitted by the wireless terminal and reflected to the test antenna 3 are the same. For instance, as shown in FIG. 2, the propagation path lengths of three electromagnetic wave signals that are emitted by the wireless terminal and reflected to the test antenna 3 is L1, L2, and L3 respectively, and L1=L2=L3. Thus phase differences of the plurality of electromagnetic wave signals caused by the propagation path are same, and in-phase superposition of the wireless signals received by the test antenna 3 may be achieved.

It should be understood that, in actual test, the ellipsoidal surface is not arranged in the system. The ellipsoidal surface is a virtual ellipsoidal surface, which is only used to describe the position relationship among the device under test 1, the test antenna 3 and the reflecting surface 2, so as to clear the position relationship among the three.

The wireless signal emitted toward direction of the test antenna 3 from the device under test 1 may be directly emitted to the test antenna 3 without reflection, which may be called a direct signal. Since the propagation path of the direct signal is different with that of the reflected signal, the phase differences caused by the propagation paths may be different too. Therefore, an effect of offset or partial superposition may be produced because of the different phase differences when the direct signal and the reflected signal arrive at the test antenna 3, thus failing to achieve objectives of in-phase superposition and power combining. Therefore, to prevent these influences, in embodiments of the present disclosure, the absorbing screen 4 is arranged on a straight line between the device under test 1 and the test antenna 3, which is configured to absorb radio waves. Thus, the direct wireless signal emitted from the device under test 1 to the test antenna 3 may be absorbed (or blocked) by the absorbing screen 4.

In an embodiment of the present disclosure, the absorbing screen 4 may be made of a wave-absorbing material. The wave-absorbing material may be a sponge dipped by carbon powder.

Since the direct signal emitted from the device under test 1 to the test antenna 3 is absorbed by the absorbing screen 4, the influence of the direct signal is no longer considered in embodiments of the present disclosure.

In an embodiment of the present disclosure, as shown in FIG. 2, the system may further include an anechoic chamber and a test instrument on the basis of FIG. 1.

The anechoic chamber includes a shielding box 5 and a wave-absorbing material 6 laid inside the shielding box 5.

The function of the shielding box 5 is to shield electromagnetic interference of outside (such as the anechoic chamber). The wave-absorbing material may be laid on the internal walls of the shielding box 5, configured to absorb the electromagnetic waves emitted to the internal walls of the shielding box 5, thereby reducing reflection in the metallic shielding box.

In an embodiment of the present disclosure, the device under test 1, the test antenna 3, the reflecting surface 2, and the absorbing screen 4 are arranged at corresponding positions by a support part made of a nonmetallic material, thus preventing the influence and error caused by reflecting the wireless signals because of using a metallic support part.

The test instrument 7 is connected with the test antenna 3, and configured to test the device under test 1 according to the one or more wireless signals received by the test antenna 3. Specifically, the test instrument 7 may perform power combining to a plurality of wireless signals received by the test antenna 3, and test according to a result of the power combining.

Implementation principles of the system for testing a wireless terminal according to embodiments of the present disclosure are illustrated below with reference to FIG. 3 and FIG. 4a to FIG. 4d.

In embodiments of the present disclosure, the number and the position of the reflecting surface 2 may be selected according to measurement demand of the device under test 1.

In an embodiment of the present disclosure, one reflecting surface may be arranged. The reflecting surface may be arranged as: a distance between the reflecting surface and the device under test is equal to a distance between the reflecting surface and the test antenna. Thereby the rotating mechanism is controlled to drive the device under test to rotate with a preset regulation, thus emitting the wireless signal of each direction to the reflecting surface in turn, and reflecting the wireless signal of each direction to the test antenna by the reflecting surface, and completing power combining of the wireless signal of each direction by the test instrument to complete the test.

Certainly, in an embodiment of the present disclosure, a plurality of reflecting surfaces may be arranged, for example, 4 reflecting surfaces may be arranged. Preferably, the 4 reflecting surfaces may be arranged in 4 directions of upper left, lower left, upper right and lower right of the device under test respectively. Thus when the wireless terminal is rotated to each position, the test antenna 3 may receive the wireless signals reflected from the 4 reflecting surfaces. Therefore, relative to the situation that only one reflecting surface is arranged, the test antenna may receive reflected signals of all wireless signals to be tested with fewer rotating times. The rotating times of the wireless terminal may be reduced to about ¼ of the rotating times when one reflecting surface is arranged, thus greatly improving the test efficiency.

Figure 3:
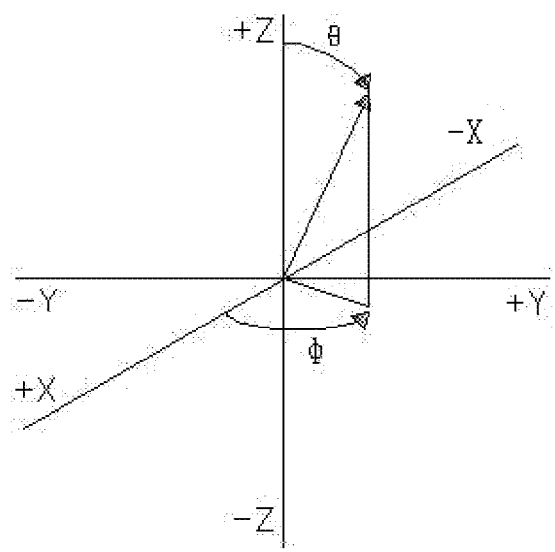
FIG. 3 is a schematic diagram of a reference coordinate system in embodiments of the present disclosure.

For convenience of description, a reference coordinate system is shown in FIG. 3, and the device to be a mobile phone is used as an example. The direction of the longer side of the mobile phone is taken as z axis, the positive direction of the z axis is along the top of the mobile phone; x axis is perpendicular to the screen of the mobile phone, and y axis is perpendicular to a plane in which the x axis and the z axis lie. Positive directions of the x axis and the y axis are shown as FIG. 3.

If radiation signals of three directions of ($\theta=30°$, $\phi=90°$), ($\theta=30°$, $\phi=270°$), and ($\theta=150°$, $\phi=90°$) (the angle $\theta$ is an angle between a direction of a radiation signal to be tested and the positive direction of the z axis, and the angle $\phi$ is an angle between a projection of the direction of the radiation signal to be tested in the XY plane and the positive direction of the x axis) are need to be tested according to test demand, three corresponding reflecting surfaces may be arranged in the three directions of ($\theta=30°$, $\phi=90°$), ($\theta=30°$, $\phi=270°$), and ($\theta=150°$, $\phi=90°$) respectively. The reflecting surface has a shape of part of the virtual ellipsoidal surface corresponding to a location of the reflecting surface, and is completely consistent with the virtual ellipsoidal surface when it is arranged at the location.

Under this kind of settings, incident signals in the three directions of ($\theta=30°$, $\phi=90°$), ($\theta=30°$, $\phi=270°$), and ($\theta=150°$, $\phi=90°$) emitted by the device under test 1 (the mobile phone) located at the focus a are reflected to the test antenna 3 located at the focus b by the reflecting surface, and then are received by the test antenna 3, and output of the test antenna 3 is a power sum of signals in the three directions. Thus the test instrument 7 may obtain the power sum of the three directions of ($\theta=30°$, $\phi=90°$), ($\theta=30°$, $\phi=270°$), and ($\theta=150°$, $\phi=90°$) of the device under test 1.

Certainly, only one reflecting surface may be arranged, by controlling the wireless terminal to rotate, so as to make a radiation signal in one of the three directions of ($\theta=30°$, $\phi=90°$), ($\theta=30°$, $\phi=270°$), and ($\theta=150°$, $\phi=90°$) is reflected to the test antenna 3 by the reflecting surface at every rotation of the wireless terminal. The power of the reflected signal received is output by the test antenna 3. The power combining of the three directions is completed by the test instrument 7.

Therefore, the number and the position of the reflecting surface 2 may be determined according to test demand. For example, FIGS. 4a to 4d are schematic diagrams of positions of a reflecting surface in embodiments of the present disclosure.

If the wireless signal of each direction of a circle should be tested for a device under test 1 with uniform radiation intensity, an annular reflecting surface perpendicular to the long axis of the ellipsoidal surface may be arranged, that is, the reflecting surface is a closed loop. The position of the annular reflecting surface may be arranged according to test demand, for example, arranged around the focus at which the device under test 1 is located shown as FIG. 4a, or arranged between the device under test 1 and the test antenna 3 shown as FIG. 4b. Thus the wireless signal in each direction of the circle the reflecting surface located at may be tested at one time. Relative to a solution that only one or more partial reflecting surfaces are arranged, the device under test 1 does not need to be rotated to make the signal emitted to each direction by the device under test 1 to reflect to the reflecting surface, thus reducing test time, and realizing fast test.

Figure 4A:
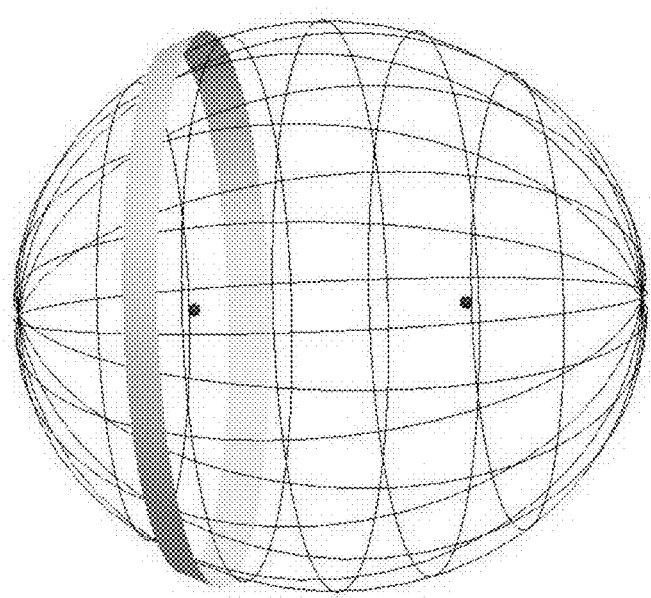
FIGS. 4a to 4d are schematic diagrams of positions of a reflecting surface in embodiments of the present disclosure.
Figure 4B:
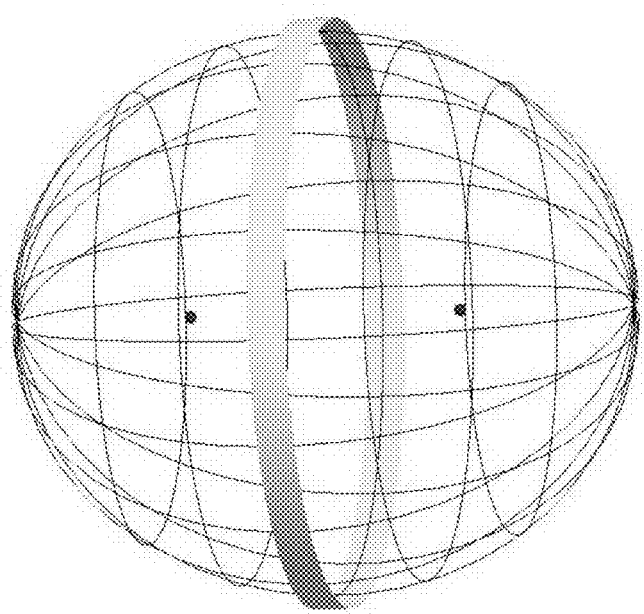
Figure 4C:
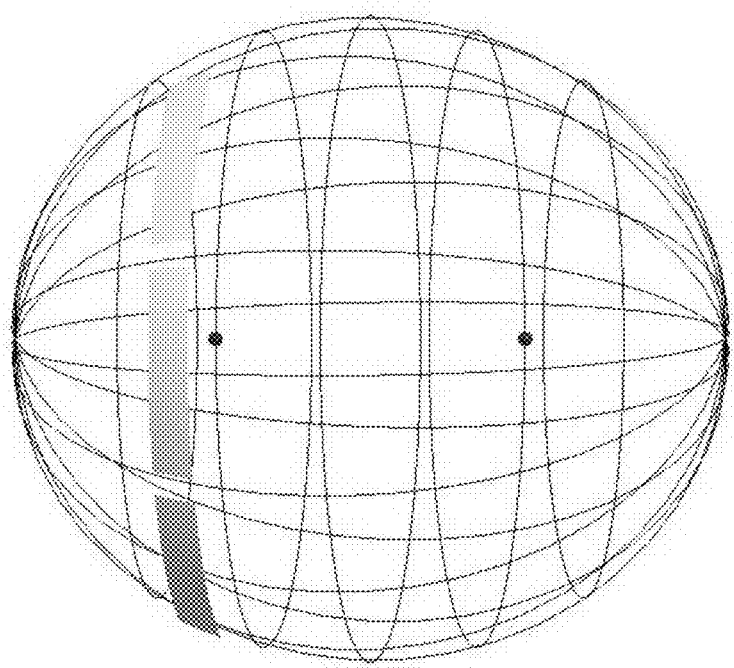
Figure 4D:
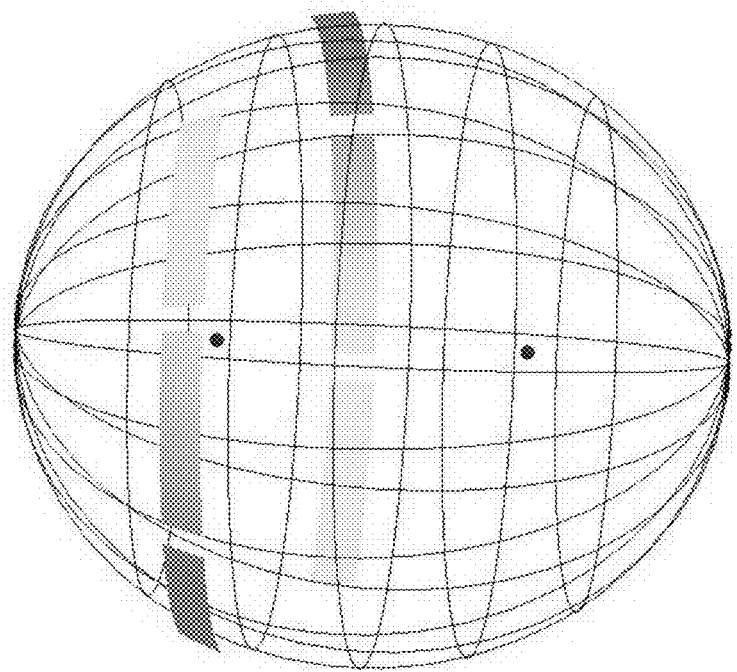

When the wireless signals of the device under test 1 in three or six directions need to be tested, the reflecting surfaces may be arranged at corresponding positions according to the angle $\theta$ and the angle $\phi$ in each direction. If the wireless signals of the device under test 1 in three directions need to be tested, three reflecting surfaces may be arranged as shown in FIG. 4c, in which the three reflecting surfaces are located around the focus at which the device under test 1 is located, a plane perpendicular to the long axis of the ellipsoidal surface and containing the focus at which the device under test 1 is located intersects the three reflecting surfaces, and the three reflecting surfaces are not opposite. If the wireless signals of the device under test 1 in six directions need to be tested, six reflecting surfaces may be arranged as shown in FIG. 4d, three reflecting surfaces of which are the same with that in FIG. 4c, opposite to and in a same plane with the other three reflecting surfaces. The same plane is perpendicular to the long axis of the ellipsoidal surface, and the other three reflecting surfaces are located around the focus at which the device under test 1 is located.

It can be seen that with a solution provided in the present disclosure, based on the test demand of the device under test 1, by converging radiation signals in the plurality of directions of the device under test 1 to the test antenna 3, in-phase superposition of the radiation signals in the plurality of directions is achieved at the test antenna 3, thus obtaining a power sum of the radiation signals in the plurality of directions at one time. If using the method in the related art, the radiation signal of each direction should be measured, and then data processed and power addition may be performed to the measuring result.

It should be noted that the device under test 1 is oriented in a direction of the test antenna 3. The wireless signal of the device under test in the direction of the test antenna 3 may not be measured because of the arranged absorbing screen 4. If the wireless signal in the direction of the test antenna 3 needs to be measured, the wireless signal in the direction of the test antenna 3 of the device under test 1 may be turned towards the reflecting surface 2 by the rotating the device under test 1, so that the wireless signal may be reflected to the test antenna 3 by the reflecting surface 2 to test.

Since reception and emission of the wireless signal are interchangeable, above descriptions can be applied in receiving test of the device under test in a similar way, which can be easily understood by those skilled in the art, and should not be described in detail.

With the system for testing a wireless terminal according to embodiments of the present disclosure, by arranging the reflecting surface according to test demand of the device under test, and by rotating the rotating mechanism to drive the device under test to rotate, such that the wireless signals in the plurality of directions of the device under test are converged to the test antenna by the reflecting surface, and the wireless signals in the plurality of directions may reach in-phase superposition and power combining at the test antenna, thus measuring the total power of the wireless signals in the plurality of directions by rotating the device under test. Relative to the system in the related art, with the system for testing a wireless terminal according to embodiments of the present disclosure test speed is higher, multiple operations for repeating are prevented, and the device under test no longer needs to be irradiated in a plane wave of the test antenna, and further, the distance between the device under test and the test antenna may be smaller than the far field distance needed in the related art, thus simplifying structure of the system, reducing size of the system, having advantages of small repetition error of test results, stable test results, high testing efficiency, and low cost, particularly being appropriate for the wireless performance authentication, development, production and other aspects of wireless terminals.

In order to implement the above embodiments, embodiments of the present disclosure provide a method for controlling a system for testing a wireless terminal.

Figure 5:
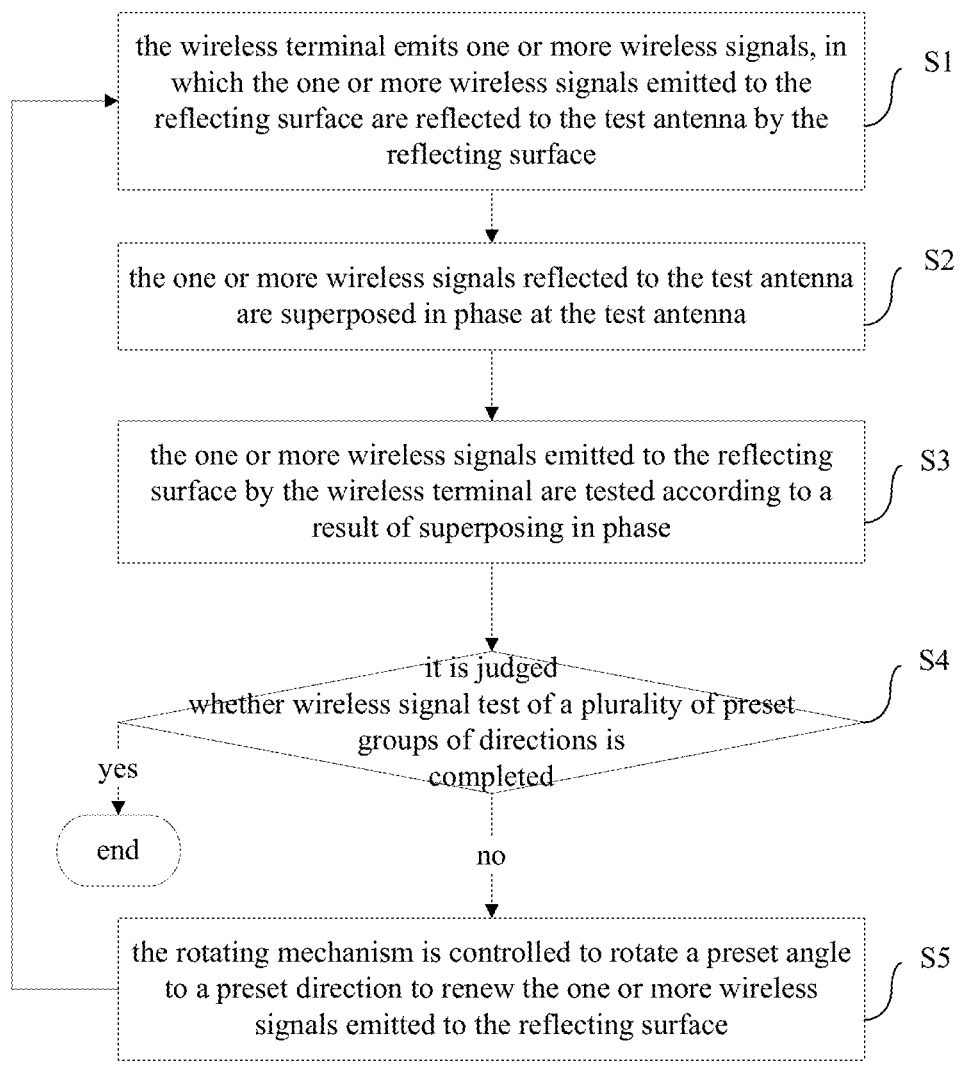
FIG. 5 is a flow chart of a method for controlling a system for testing a wireless terminal according to an embodiment of the present disclosure.

FIG. 5 is a flow chart of a method for controlling a system for testing a wireless terminal according to an embodiment of the present disclosure.

The system for testing a wireless terminal includes: a wireless terminal, a test antenna configured to receive one or more wireless signals, a reflecting surface configured to totally reflect one or more wireless signals emitted by the wireless terminal, a rotating mechanism configured to fix the device under test and to drive the device under test to rotate, and an absorbing screen configured to absorb a radio wave. The device under test and the test antenna are arranged at two foci of an ellipsoidal surface respectively, the reflecting surface is arranged on the same ellipsoidal surface, and the absorbing screen is arranged on a straight line between the device under test and the test antenna.

As shown in FIG. 5, the method for controlling a system for testing a wireless terminal according to an embodiment of the present disclosure includes followings.

In block S1, the wireless terminal emits one or more wireless signals, in which the one or more wireless signals emitted to the reflecting surface are reflected to the test antenna by the reflecting surface.

In embodiments of the present disclosure, the number and the position of the reflecting surface may be selected according to measurement demand of the device under test.

In an embodiment of the present disclosure, one reflecting surface may be arranged. The reflecting surface may be arranged as: a distance between the reflecting surface and the device under test is equal to a distance between the reflecting surface and the test antenna. Thereby the rotating mechanism is controlled to drive the device under test to rotate with a preset regulation, thus emitting the wireless signal of each direction to the reflecting surface in turn, and reflecting the wireless signal of each direction to the test antenna by the reflecting surface, and completing power combining of the wireless signal of each direction by the test instrument to complete the test.

Certainly, in an embodiment of the present disclosure, a plurality of reflecting surfaces may be arranged, for example, 4 reflecting surfaces may be arranged. Preferably, the 4 reflecting surfaces may be arranged in 4 directions of upper left, lower left, upper right and lower right of the device under test respectively. Thus when the wireless terminal is rotated to each position, the test antenna 3 may receive the wireless signals reflected from the 4 reflecting surfaces. Therefore, relative to the situation that only one reflecting surface is arranged, the test antenna may receive reflected signals of all wireless signals to be tested with fewer rotating times. The rotating times of the wireless terminal may be reduced to about ¼ of the rotating times when one reflecting surface is arranged, thus greatly improving the test efficiency.

In block S2, the one or more wireless signals reflected to the test antenna are superposed in phase at the test antenna.

In block S3, the one or more wireless signals emitted to the reflecting surface by the wireless terminal are tested according to a result of superposing in phase.

Specifically, the wireless terminal may be tested by a test instrument according to the result of superposing in phase of the wireless signals reflected to the test antenna.

In block S4, it is judged whether wireless signal test of a plurality of preset groups of directions is completed.

If no, implement step S5, if yes, go to the end.

In block S5, the rotating mechanism is controlled to rotate a preset angle to a preset direction to renew the one or more wireless signals emitted to the reflecting surface, and S1 to S4 are repeated.

In embodiments of the present disclosure, the wireless signal emitted by the wireless terminal may be an electromagnetic wave signal. According to physical principles of ellipsoidal reflection, an electromagnetic wave signal emitted from one focus may be reflected to the other focus by the ellipsoidal surface, and the sum of distances between any point on the ellipsoidal surface and the two foci of the ellipsoidal surface is a fixed value. Therefore, the electromagnetic wave signal emitted by the wireless terminal may be reflected to the test antenna by the reflecting surface, and propagation path lengths of a plurality of electromagnetic wave signals that are emitted by the wireless terminal and reflected to the test antenna are the same. For instance, as shown in FIG. 2, the propagation path lengths of three electromagnetic wave signals that are emitted by the terminal and reflected to the test antenna is L1, L2, and L3 respectively, and L1=L2=L3. Thus phase differences of the plurality of electromagnetic wave signals caused by the propagation path are same, and in-phase superposition of the wireless signals received by the test antenna 3 may be achieved.

It should be understood that, in actual test, the ellipsoidal surface is not arranged in the system. The ellipsoidal surface is a virtual ellipsoidal surface, which is only used to describe the position relationship among the device under test, the test antenna and the reflecting surface, so as to clear the position relationship among the three.

The wireless signal emitted toward direction of the test antenna from the device under test may be directly emitted to the test antenna without reflection, which may be called a direct signal. Since the propagation path of the direct signal is different with that of the reflected signal, the phase differences caused by the propagation paths may be different too. Therefore, an effect of offset or partial superposition may be produced because of the different phase differences when the direct signal and the reflected signal arrive at the test antenna, thus failing to achieve objectives of in-phase superposition and power combining. Therefore, to prevent these influences, in embodiments of the present disclosure, the absorbing screen is arranged on a straight line between the device under test and the test antenna, which is configured to absorb radio waves. Thus, the direct signal emitted from the device under test to the test antenna may be absorbed (or blocked) by the absorbing screen.

In an embodiment of the present disclosure, the absorbing screen may be made of a wave-absorbing material. The wave-absorbing material may be a sponge dipped by carbon powder.

Since the direct signal emitted from the device under test to the test antenna is absorbed by the absorbing screen, the influence of the direct signal is no longer considered in embodiments of the present disclosure.

In an embodiment of the present disclosure, the device under test, the test antenna, the reflecting surface, and the absorbing screen are arranged at corresponding positions by a support part made of a nonmetallic material, thus preventing the influence and error caused by reflecting the wireless signals because of using a metallic support part.

Specifically, implementation principles of the system for testing a wireless terminal according to embodiments of the present disclosure may refer to the embodiments shown in FIG. 3 and FIG. 4a to FIG. 4d, which should not be described in detail.

With the method for controlling a system for a wireless terminal according to embodiments of the present disclosure, by arranging the reflecting surface according to test demand of the device under test, and by rotating the rotating mechanism to drive the device under test to rotate, such that the wireless signals in the plurality of directions of the device under test are converged to the test antenna by the reflecting surface, and the wireless signals in the plurality of directions may reach in-phase superposition and power combining at the test antenna, thus measuring the total power of the wireless signals in the plurality of directions by rotating the device under test. Relative to the system in the related art, with the system for testing a wireless terminal according to embodiments of the present disclosure test speed is higher, multiple operations for repeating are prevented, and the device under test no longer needs to be irradiated in a plane wave of the test antenna, and further, the distance between the device under test and the test antenna may be smaller than the far field distance needed in the related art, thus simplifying structure of the system, reducing size of the system, having advantages of small repetition error of test results, stable test results, high testing efficiency, and low cost, particularly being appropriate for the wireless performance authentication, development, production and other aspects of wireless terminals.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial," and "circumference" should be construed to refer to the orientation as then described or as shown in the drawings under discussion. These relative terms are for convenience of description and do not require that the present invention be constructed or operated in a particular orientation.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, such as two, three etc., unless specified otherwise.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A system for testing a wireless terminal, comprising:
a device under test, wherein the device under test is a wireless terminal;
a reflecting surface, configured to totally reflect one or more wireless signals emitted by the wireless terminal;
a rotating mechanism, configured to fix the device under test, and to drive the device under test to rotate, such that wireless signals emitted by the wireless terminal in a plurality of directions are emitted to the reflecting surface in turn;
a test antenna, configured to receive one or more wireless signals reflected; and
an absorbing screen, configured to absorb a radio wave;
wherein the device under test, the test antenna and the reflecting surface correspond to a same ellipsoidal surface, the device under test and the test antenna are arranged at two foci of the ellipsoidal surface respectively, the reflecting surface is arranged on the ellipsoidal surface, and
the absorbing screen is arranged on a straight line between the device under test and the test antenna.

2. The system according to claim 1, wherein the number of the reflecting surface is 1, and a distance between the reflecting surface and the device under test is equal to a distance between the reflecting surface and the test antenna.

3. The system according to claim 1, wherein the number of the reflecting surface is 4, and the 4 reflecting surfaces are arranged in 4 directions of upper left, lower left, upper right and lower right of the device under test respectively.

4. The system according to claim 1, further comprising: an anechoic chamber, wherein the device under test, the test antenna, the reflecting surface, and the absorbing screen are arranged in the anechoic chamber, and the anechoic chamber comprises:
a shielding box and a wave-absorbing material laid inside the shielding box.

5. The system according to claim 1, further comprising: a test instrument, connected with the test antenna, and configured to test the device under test according to the one or more wireless signals received by the test antenna.

6. The system according to claim 1, wherein the absorbing screen is made of a wave-absorbing material.

7. The system according to claim 6, wherein the wave-absorbing material is a sponge dipped by carbon powder.

8. The system according to claim 1, wherein the device under test, the test antenna, the reflecting surface and the absorbing screen are arranged at corresponding positions by a support part made of a nonmetallic material.

9. The system according to claim 2, wherein the reflecting surface is a closed loop.

10. A method for controlling a system for testing a wireless terminal, wherein the system for testing a wireless terminal comprises: a wireless terminal, a test antenna configured to receive one or more wireless signals, a reflecting surface configured to totally reflect one or more wireless signals emitted by the wireless terminal, a rotating mechanism configured to fix the device under test and to drive the device under test to rotate, and an absorbing screen configured to absorb a radio wave, in which the device under test and the test antenna are arranged at two foci of an ellipsoidal surface respectively, the reflecting surface is arranged on the same ellipsoidal surface, the absorbing screen is arranged on a straight line between the device under test and the test antenna, and the method comprises:

S1, emitting, by the wireless terminal, one or more wireless signals, wherein one or more wireless signals emitted to the reflecting surface are reflected to the test antenna by the reflecting surface;

S2, superposing the one or more wireless signals reflected to the test antenna in phase at the test antenna;

S3, testing the one or more wireless signals emitted to the reflecting surface by the wireless terminal according to a result of superposing in phase; and S4, controlling the rotating mechanism to rotate a preset angle to a preset direction to renew the one or more wireless signals emitted to the reflecting surface, and repeating the S1 to S4 until wireless signal test of a plurality of preset groups of directions is completed.

11. The method according to claim 10, wherein the number of the reflecting surface is 1, and a distance between the reflecting surface and the device under test is equal to a distance between the reflecting surface and the test antenna.

12. The method according to claim 10, wherein the number of the reflecting surface is 4, and the 4 reflecting surfaces are arranged in 4 directions of upper left, lower left, upper right and lower right of the device under test respectively.

* * * * *